United States Patent [19]
Davies et al.

[11] Patent Number: 5,418,674
[45] Date of Patent: May 23, 1995

[54] MULTI-LEAD PROTECTED POWER DEVICE HAVING CURRENT AND BOOT-STRAP INPUTS

[75] Inventors: Robert B. Davies, Tempe; David F. Mietus, Phoenix, both of Ariz.

[73] Assignee: Motorola, Inc., Schaumburg, Ill.

[21] Appl. No.: 95,573

[22] Filed: Jul. 19, 1993

[51] Int. Cl.$^6$ .................................... H02H 9/00
[52] U.S. Cl. ........................................ 361/18; 361/93
[58] Field of Search ................ 361/18, 57, 58, 87, 361/90, 91, 92, 93; 323/276; 307/570, 573, 250

[56] References Cited

U.S. PATENT DOCUMENTS 4,408,136  10/1983  Kirsch .......................... 307/573
5,047,662   9/1991  Edwards ...................... 307/296.4

Primary Examiner—A. D. Pellinen
Assistant Examiner—Ronald W. Leja
Attorney, Agent, or Firm—Rennie William Dover

[57] ABSTRACT

A multi-leaded protected power device having a boot-strap input has been provided. The power device includes a current controlled, boot-strap driven control die (20) for use with a power transistor (25). The control die includes an under voltage lock-out circuit (46) which inhibits drive to the power transistor until the input signals exceed a predetermined threshold level. Moreover, the control die includes a noise immunity enhancement circuit (56) for providing an excess reverse bias across an output SCR (58) for preventing false triggering of the output SCR. The power device further includes a status output lead (204) for indicating when a voltage occurring across the power transistor has exceeded a predetermined threshold, and a current output lead (220) for providing a current that is proportional to a current flowing through the power transistor.

16 Claims, 6 Drawing Sheets

000
MULTI-LEAD PROTECTED POWER DEVICE HAVING CURRENT AND BOOT-STRAP INPUTS

FIELD OF THE INVENTION

This invention relates to circuits, for example, a multi-lead protected power device having current and boot-strap inputs.

BACKGROUND OF THE INVENTION

Power devices are utilized in a plurality of circuit applications that require high voltage and current capability, for example, automotive circuits. However, power devices must be protected from large surge currents which could destroy the device.

Control circuits are typically utilized to protect power transistors by, for example, monitoring the current flowing through the power transistor. Some control circuits have an input driven by a voltage signal. However, this type of circuit is not suitable for use as a high side switch wherein the load is connected to the emitter of a power transistor. Also, voltage control driven circuits are limited by ground bounce, especially when driving large inductive loads. Moreover, these applications require a current input control circuit.

One such control circuit for protecting a power device is fully disclosed in U.S. Pat. No. 5,285,346 issued to Davies et al. on Feb. 8, 1994 and entitled "CURRENT DRIVEN CONTROL CIRCUIT FOR A POWER DEVICE". The control circuit disclosed here is a current driven control circuit. However, this current driven control circuit requires the input current to be limited in a controlled manner, for example by a staircase input signal.

Hence, there is a need for an improved current controlled circuit for protecting a power transistor that monitors the condition of the power transistor and does not require a specialized input current signal.

DETAILED DESCRIPTION OF THE DRAWINGS

Figure 1:
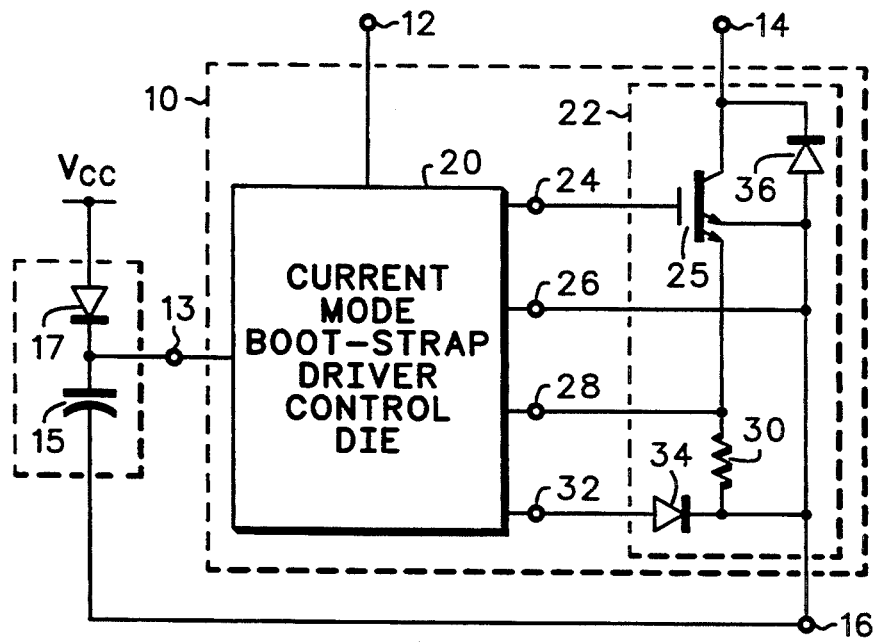
FIG. 1 is a schematic/block diagram illustrating a four-leaded current control, boot-strap driven control circuit coupled to a power device for protecting the power device.

Referring to FIG. 1, there is illustrated four leaded device 10 having current input terminal 12, boot-strap input terminal 13, and first and second terminals 14 and 16. Device/package 10 includes current controlled, boot-strap driven control die 20 for protecting power device 22.

Power device 22 includes insulated gate bipolar transistor 25 which has a collector coupled to terminal 14 and a first emitter coupled to terminal 16. Power device 22 also includes diode 36 being coupled across current carrying terminals 14 and 16 whereby the anode of diode 36 is coupled to terminal 16 and the cathode of diode 36 is coupled to terminal 14. The control electrode of transistor 25 is coupled to terminal 24. Control die 20 is coupled to terminal 24 and to terminal 26 which is coupled to the first emitter of transistor 25. Control die 20 is also coupled to terminal 28 which is subsequently coupled to a second emitter of transistor 25. Terminal 28 is also coupled through resistor 30 to terminal 16. Finally, control die 20 is coupled to terminal 32 which is subsequently coupled through diode 34 to the first emitter of transistor 25.

In general, control die 20 controls whether power device 22 is rendered operative or non-operative because an input current signal must first be applied at terminal 12 of control die 20 before enabling current to be supplied by boot-strap terminal 13 to the control electrode of transistor 25. Thus, if control die 20 detects a fault condition within power device 22 (via terminals 26, 28 and 32) then control die 20 can disable power device 22 by removing the voltage appearing at the control electrode of transistor 25.

The technique used to incorporate control die 20 and power device 22 in package 10 may be, for example, the "chip on a lead" technique disclosed in U.S. Pat. No. 5,170,312, issued Dec. 8, 1992, which discloses the concept of mounting control die 20 on the control electrode lead of power device 22.

It is understood that resistor 30 and the second emitter of power device 22 constitutes a typical method of sensing current through power die. However, it is understood that the current sense input to voltage driven control die 20 may be coupled to other current sense means.

Boot-strap input terminal 13 allows the use of a current input to be applied to control die 20 via input current terminal 12. In particular, boot-strap input 13 is coupled through capacitor 15 to terminal 16 (the first emitter of transistor 25). Further, diode 17 is coupled between terminal 13 and a first supply voltage terminal.

In operation, diode 17 is utilized to initially provide charging current for boot strap capacitor 15 and then diode 17 acts as a blocking diode once it becomes reversed biased. The charge collected on boot strap capacitor 15 then serves as the power supply to control die 20 when device 10 is enabled.

Figure 2:
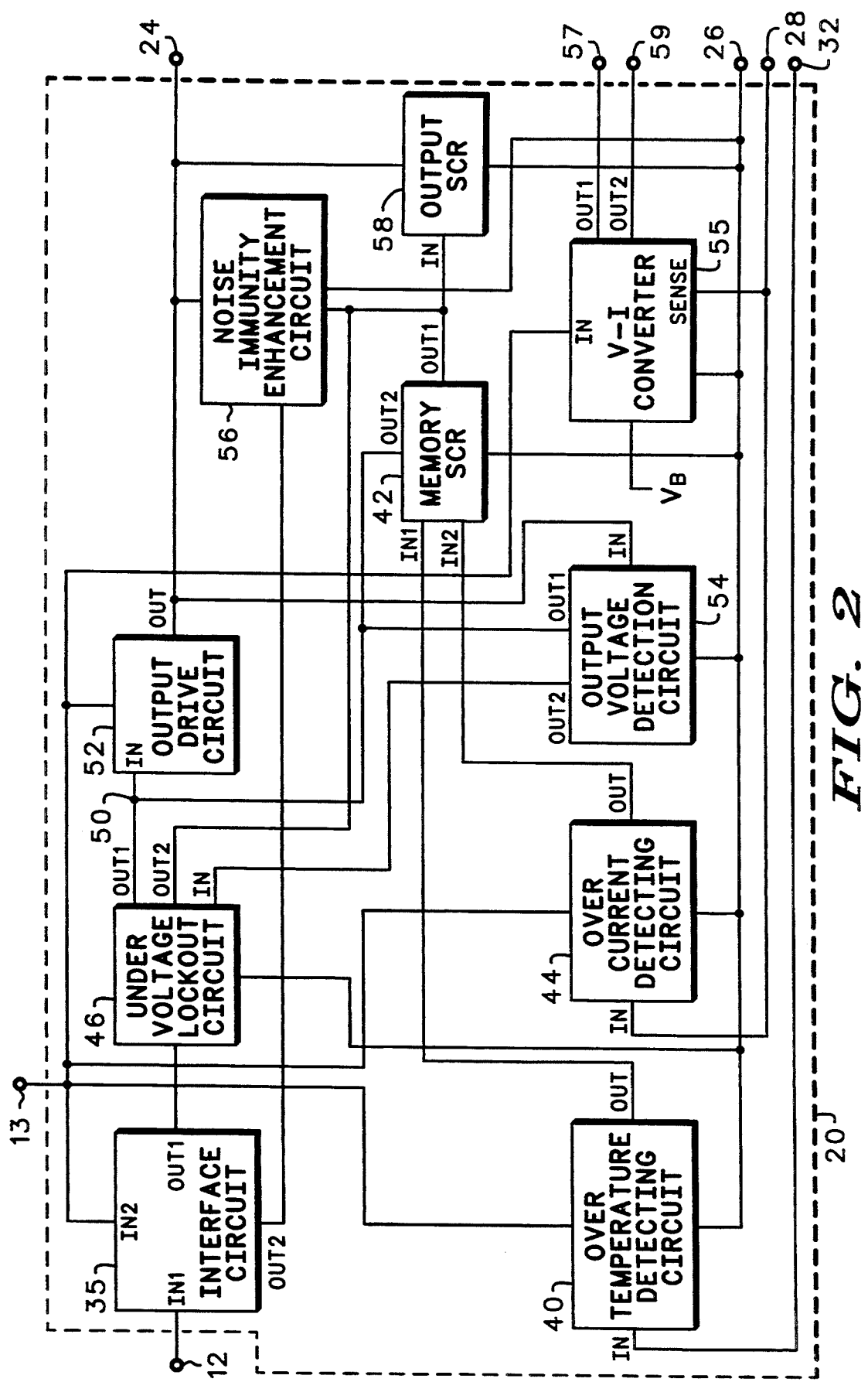
FIG. 2 is a detailed block diagram illustrating the current controlled, boot-strap driven control circuit of FIG. 1.

Referring to FIG. 2, a detailed schematic/block diagram of control die 20 is shown. It is understood that the components shown in FIG. 2 which are identical to components shown in FIG. 1 are identified by the same reference numbers.

Control die 20 includes input interface circuit 35 having first and second inputs respectively coupled to terminals 12 and 13 interface circuit 35 has a first output coupled to a first input of under voltage lockout circuit 46 and second output coupled to an input of noise immunity enhancement circuit 56. Interface circuit 35 has an input coupled to receive the input current signal applied at terminal 12 for providing predetermined voltages at first and second outputs of interface circuit 35.

Control die 20 also includes over temperature detection circuit 40 being coupled between terminals 13 and 26. Over temperature detection circuit 40 is responsive to the voltage appearing at terminal 32, and having an output for providing a signal to a first input of memory SCR 42.

Similarly, over current detection circuit 44 is coupled between terminals 13 and 26. Over current detection circuit 44 is responsive to a voltage appearing at terminal 28, and having an output for providing a signal to a second input of memory SCR 42.

Under voltage lock-out circuit 46 is coupled between the first output of interface circuit 35 and terminal 26 and has a first output coupled to circuit node 50 which is subsequently coupled to the control input of output drive circuit 52. Circuit 46 has second output coupled to an input terminal of output SCR 58. Under voltage lock-out circuit 46 also has a second input coupled to a second output of output voltage detection circuit 54. Output drive circuit 52 also has an input coupled to terminal 13 and an output coupled to terminal 24.

It is worth noting that under voltage lock out circuit 46 has a high output impedance, for example, a current source output. Further, the first output of under voltage lock out circuit 46 provides a control signal to the control input of output drive circuit 52 wherein this represents a control path to output drive circuit 52, while output drive circuit 52 also is coupled to terminal 13 for providing a high current path.

Memory SCR 42 has a terminal coupled to terminal 26 and a first output coupled to an input of output SCR 58. Further, memory SCR 42 has a second output coupled to circuit node 50.

Output SCR 58 has first and second terminals respectively coupled to terminals 24 and 26.

Voltage-Current (V-I) converter 55 has an input and a sense terminal respectively coupled to terminals 13 and 28, and has a bias input coupled to receive a bias voltage $V_B$. V-I converter 55 has first and second outputs coupled to terminals 57 and 59. In general, converter 55 has a sense input responsive to the voltage appearing at terminal 28 which is proportional to the current flowing through power transistor 25. Further, converter 55 provides a current at terminal 59 which is proportional to the voltage sensed at terminal 28. Thus, the current provided at terminal 59 is proportional to the current flowing through power transistor 25. Moreover, converter 55 provides a bias voltage at terminal 57.

It is worth noting that the boot-strap voltage generated at terminal 13 is the voltage supply to circuits 35, 40, 44, 52, and 55. Moreover, since terminal 12 represents the control input to device 10, any input signal must first pass through control die 20.before being supplied to power transistor 25.

Output voltage detection circuit 54 is coupled between the output of output drive circuit 52 and terminal 26, and has first and second outputs respectively coupled to circuit node 50 and the second input of under voltage lockout circuit 46. Output voltage detection circuit 54 provides limiting for output drive circuit 52, via under voltage lockout circuit 46, when the voltage appearing across terminals 24 and 26 exceeds a predetermined threshold.

Noise immunity enhancement circuit 56 is coupled to terminal 26 and between terminal 24 and the input of output SCR 58. Noise immunity enhancement circuit 56 also has an input responsive to a signal applied at terminal 12 via the second output of interface circuit 35.

In operation and upon turn on, the voltage appearing at terminal 24 is substantially equal to zero volts and an input current signal is applied at terminal 12 for turning on power device 22 ( of FIG. 1). Interface circuit 35 is responsive to the signal applied to terminal 12 for providing current signals at its first and second outputs wherein such current signals are a portion of the signal applied to terminal 12.

Under voltage lock-out circuit 46 is responsive to the voltage appearing at boot-strap terminal 13 such that if the voltage appearing at boot-strap terminal 13 is below a predetermined threshold, for example, 13.6 volts, then under voltage lock-out circuit 46 will not provide drive to output drive circuit 52. In addition, under voltage lock-out circuit 46 functions in that as the first current output of interface circuit 35 increases, under voltage lock-out circuit 46 will not provide any drive to the input of output drive circuit 52 until the current supplied via the first current output of interface circuit 35 exceeds a predetermined threshold. This threshold is the current necessary to generate sufficient bias across resistor 72 to enable transistor 74, as well as the voltage necessary to render zener diode 70 active. Once the predetermined threshold is exceeded, under voltage lock-out circuit 46 then provides drive to output drive circuit 52 which provides drive to terminal 24 thereby increasing the voltage appearing at terminal 24 (and thus increasing the voltage applied to the control electrode of power device 22).

In summary, under voltage lockout circuit 46 does not provide drive signal to output drive circuit 52 until the voltage appearing at boot-strap terminal 13 and the current supplied by the first current output of interface circuit 35 exceeds a predetermined threshold.

As the voltage appearing at terminal 24 increases, output voltage detection circuit 54 senses this voltage and when this voltage exceeds a predetermined threshold, for example, approximately 11 volts, output voltage detection circuit 54 is activated and reduces the current drive provided to output drive circuit 52 thereby functioning to limit the further charging of terminal 24.

Now once the voltage appearing at terminal 24 has increased to a value such that power device 22 is turned on, the current and temperature of power device 22 are monitored via over current detection circuit 44 and over temperature detection circuit 40, respectively. In particular, when the voltage across resistor 30 (of FIG. 1) exceeds a predetermined voltage level, over current detection circuit 44 functions to supply a signal to the second input of memory SCR 42 thereby activating and firing memory SCR 42. Similarly, if the temperature of power device 22 exceeds a predetermined temperature, the forward voltage drop of diode 34 will be reduced such that over temperature detection circuit 40 functions to supply a signal to the first input of memory SCR 42 thereby activating and firing memory SCR 42. Thus, it is understood that either over current detection circuit 44 or over temperature detection circuit 40 is capable of firing memory SCR 42.

Once memory SCR 42 fires, its first output is cascaded with an input of output SCR 58 thereby functioning to fire output SCR 58. Moreover, when output SCR 58 is fired, it functions to rapidly decrease the voltage appearing at terminal 24 due to a fault condition of either over current or over temperature. Also, when memory SCR 42 is fired, its second output sinks the current flowing at circuit node 50 thereby disabling output drive circuit 52. Further, this current is sufficient to prevent drop-out from occurring in memory SCR 42.

Figure 4:
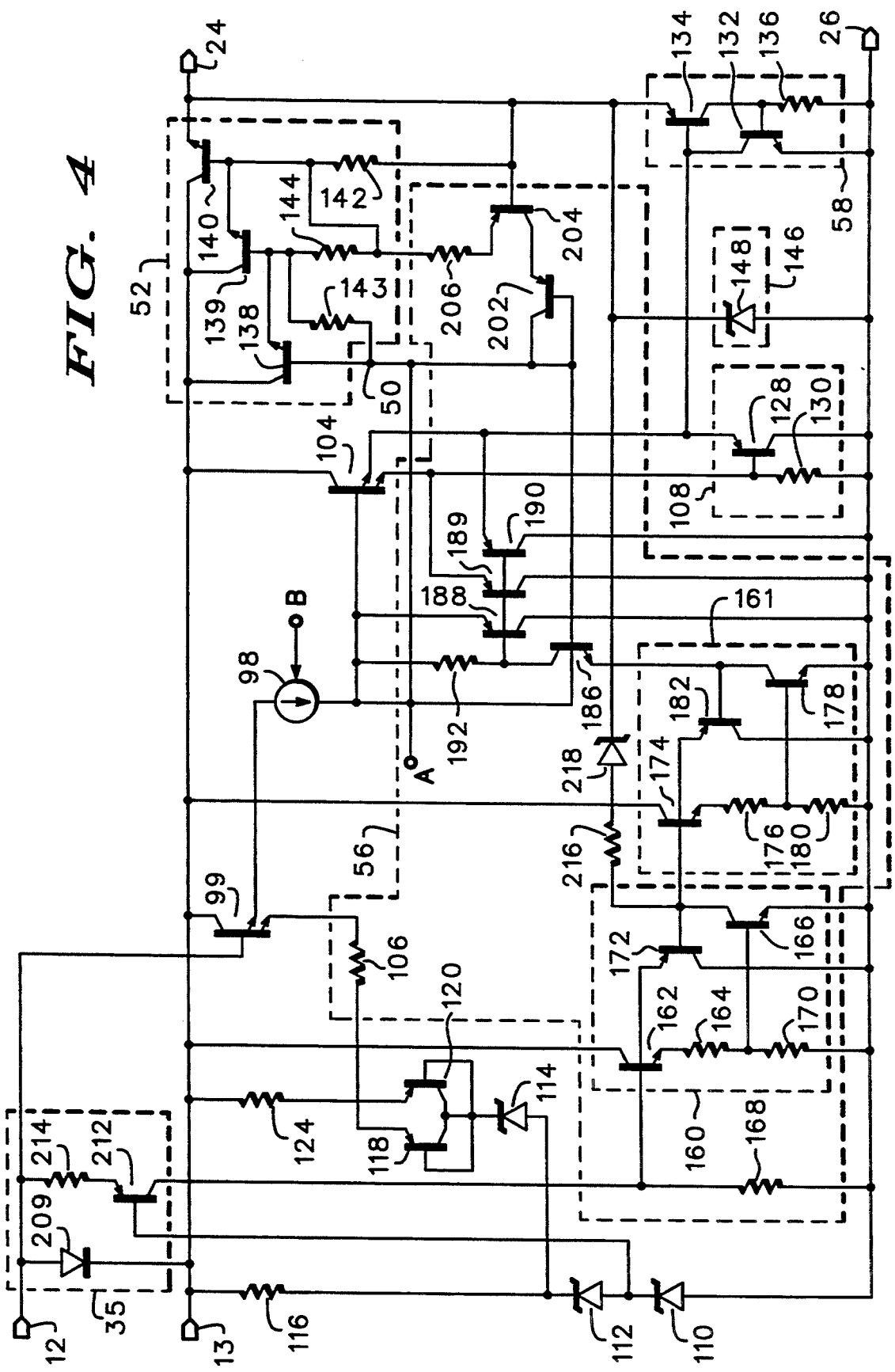
FIG. 4 is a detailed schematic diagram illustrating a portion of the current controlled, boot-strap driven control circuit for implementing the noise immunity enhancement circuit of FIG. 2.

In addition, noise immunity enhancement circuit 56 is provided wherein circuit 56 supplies an excess reverse bias voltage across output SCR 58 when under voltage lock-out circuit 46 provides drive signal to output drive circuit 52 thereby preventing false triggering of output SCR 58. This false triggering can become a problem especially when terminal 24 is being utilized to drive devices having large capacitive inputs, which in turn are driving large inductive loads. It must be understood that by providing excess reverse bias for output SCR 58, additional circuitry is required that allows output SCR 58 to be turned off quickly. This additional circuitry is shown in FIG. 4 and will be discussed in detail hereinafter.

Figure 3:
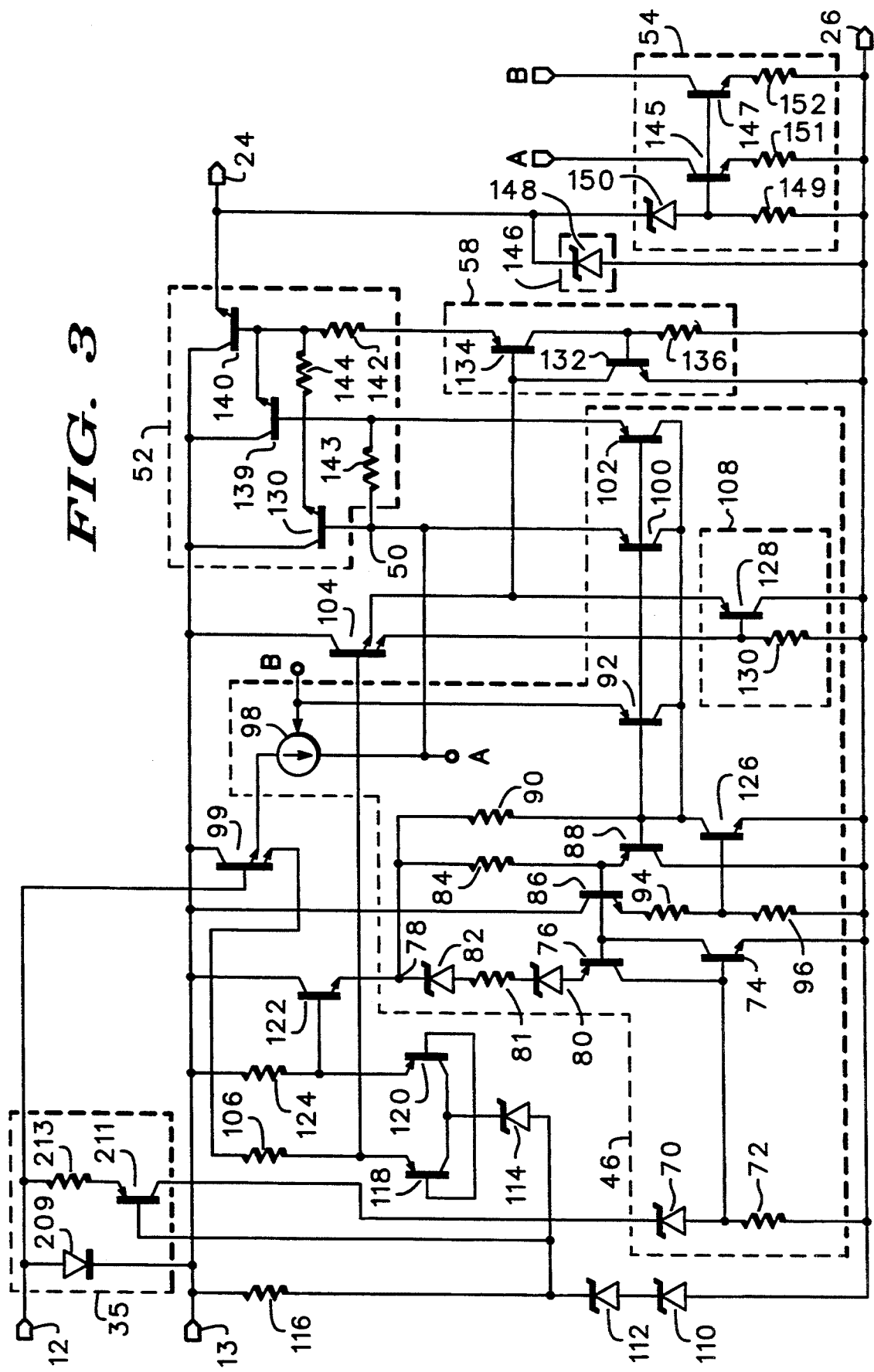
FIG. 3 is a detailed schematic diagram illustrating a portion of the current controlled, boot-strap driven control circuit for implementing the under voltage lockout circuit of FIG. 2.

Referring to FIG. 3, a portion of control die 20 is shown for illustrating the detailed operation of under voltage lock-out circuit 46. It is understood that components shown in FIG. 3 that are identical to components shown in FIGS. 1 and 2 are identified by the same reference numbers.

In particular, under voltage lock-out circuit 46 includes sub-circuit 108, which comprises a voltage clamp consisting of transistor 128 and resistor 130. Transistor 128 has its emitter coupled to the first emitter of transistor 104 and a collector coupled to terminal 26. The base of transistor 128 is coupled through resistor 130 to terminal 26. The base of transistor 128 is further coupled to the second emitter of transistor 104.

Under voltage lock-out circuit 46 also includes zener diode 70 having an anode coupled through resistor 72 to terminal 26. The anode of diode 70 is also coupled to the base of transistor 74 and to the collector of the transistor 76. The cathode of diode 70 represents the input to under voltage lockout circuit 46. The emitter of transistor 74 is coupled to terminal 26 while the collector of transistor 74 is coupled to the base of transistor 76. The emitter of transistor 76 is coupled to circuit node 78 via serially coupled elements: zener diode 80, resistor 81 and zener diode 82.

Circuit node 78 is coupled through resistor 84 and then to both the bases of transistor 86 and 76 and the emitter of transistor 88. Similarly, circuit node 78 is coupled through resistor 90 and then both to the base of transistor 88 and the base of transistor 92. The collectors of transistors 88 and 92 are both coupled to terminal 26. The collector of transistor 86 is coupled to terminal 13, while the emitter of transistor of 86 is coupled through resistors 94 and 96 to terminal 26. Transistor 126 has a collector coupled to the base of transistor 88 and an emitter coupled to terminal 26. The base of transistor 126 is coupled to the common point between serially coupled resistors 94 and 96.

The emitter of transistor 92 is coupled to a control terminal of switchable current source 98 and to a second output (B) of output voltage detection circuit 54. Current source 98 has first and second terminals respectively coupled to a first emitter of transistor 99 and circuit node 50 wherein the second terminal of current source 98 represents the output of under voltage lock-out detection circuit 46. The second terminal of current source 98 is also coupled to a first output (A) of over voltage detection circuit 54.

The bases of transistors 100 and 102 are coupled to the base of transistor 92 while the collectors of transistors 100 and 102 are coupled to the collector of transistor 92. The emitters of transistors 100 and 102, which represent outputs of under voltage lock-out circuit 46 are coupled to output drive circuit 52 wherein in particular, the emitter of transistor 100 is coupled to circuit node 50.

The circuit shown in FIG. 3 further includes transistor 104 having a collector coupled to terminal 13 and a base coupled through resistor 106 to the second emitter of transistor 99. A first emitter of transistor 104 is coupled to output SCR 58 and to the emitter of transistor 128 of output clamp circuit 108. The second emitter of transistor 104 is coupled to the base of transistor 128 of output clamp circuit 108.

The circuit shown in FIG. 3 also includes bias circuitry including zener diode 110 which has an anode coupled to terminal 26 and a cathode coupled to the anode of zener diode 112. The cathode of zener diode 112 is coupled through resistor 116 to terminal 13.

Transistor 118 has an emitter coupled to the base of transistor 104 and to a second emitter of transistor 99 through resistor 106. Transistor 99 has a collector coupled to terminal 13, and a base coupled to terminal 12. The base and collector of transistor 118 are coupled to the cathode of zener diode 114. Transistor 120 has an emitter coupled to the base of transistor 122 and through resistor 124 to terminal 13. The collector and base of transistor 120 is coupled to the cathode of zener diode 114. The anode of diode 114 is coupled to the cathode of diode 112. The collector of transistor 122 is coupled to terminal 13 while the emitter of transistor 122 is coupled to circuit node 78.

Output SCR 58 includes transistor 132 having a collector coupled to the base of transistor 134 and an emitter coupled to terminal 26. The base of transistor 132 is coupled to the collector of transistor 134 and through resistor 136 to terminal 26. The base of transistor 134 is coupled to the first emitter of transistor 104. Moreover, the emitter of transistor 134 is coupled to terminal 24.

Output drive circuit 52 includes Darlington configured transistors 138, 139 and 140. In particular, the base of transistor 138 is coupled to circuit node 50 while the collector of transistor 138 is coupled to terminal 13. The emitter of transistor 138 is coupled to the base of transistor 139 and to the emitter of transistor 102. The collectors of transistors 139 and 140 are coupled to terminal 13. The emitter of transistor 139 is coupled to the base of transistor 140 and through resistor 142 to terminal 24. Resistor 143 is coupled between the bases of transistors 138 and 139, while resistor 144 is coupled between the bases of transistors 139 and 140. Finally, the emitter of transistor 140 is coupled to terminal 24.

In addition, the circuit in FIG. 3 includes output voltage clamp 146 which is coupled between terminals 24 and 26. In particular, clamp 146 includes zener diode 148 wherein the cathode of diode 148 is coupled to terminal 24 and the anode of diode 148 is coupled to terminal 26.

Also shown in FIG. 3 is output voltage detection circuit 54 which includes transistors 145 and 147 each having their emitters coupled to terminal 26 through resistors 151 and 152 respectively, and their bases coupled through resistor 149 to terminal 26. The collector of transistor 145, which represents the first output of output voltage detection circuit 54, is coupled to circuit node 50, while the collector of transistor 147, which represents the second output of output voltage detection circuit 54, is coupled to the control terminal of programmable current source 98. The bases of transistors 145 and 147 are also coupled to an anode of zener diode 150. The cathode of zener diode 150, which represents the input of output voltage detection circuit 54, is coupled to terminal 24.

The circuit shown in FIG. 3 also includes a portion of interface circuit 35 that is needed for describing the operation of under voltage lockout circuit 46. In particular, interface circuit 35 includes diode 209 having its anode and cathode respectively coupled to terminals 12 and 13. Transistor 211 has a collector coupled to the cathode of diode 70 and a base coupled to the cathode of diode 112 wherein the collector of transistor 211 represents the first output of interface circuit 35. The emitter of transistor 211 is coupled through resistor 213 to terminal 12.

In operation, under voltage lock-out circuit 46 functions to clamp terminal 24 to a predetermined voltage until the current supplied via the collector of transistor 211 (the input of under voltage lockout circuit 46) exceeds a predetermined threshold. It is understood that the current supplied via the collector of transistor 211 is proportional to the input current signal applied at terminal 12 and is also dependent upon the voltage appearing at boot-strap terminal 13. Thus, when the current supplied via the collector of transistor 211 and the voltage appearing at boot-strap terminal 13 exceed predetermined thresholds, it can be said that the current signal appearing at terminal 12 also exceeds some predetermined threshold. In particular, assuming that the current supplied via the collector of transistor 211 is below a predetermined threshold, a damping circuit functions to not allow the voltage at terminal 24 to exceed a predetermined voltage. In particular, when the voltage appearing at terminal 24 exceeds approximately $2V_{BE}$, transistors 134 and 128 are rendered operative and the voltage appearing at terminal 24 is damped, for example, to 1.2 volts. Further, assuming that resistor 94 is twice the value of resistor 96, components 86, 88, 126, 94 and 96 function to clamp the voltage appearing at the bases of transistors 88, 92, 100 and 102 to approximately $3V_{BE}$. As a result, circuit node 50 (the input of output drive circuit 52) is clamped to approximately $4V_{BE}$ via transistor 100.

However, when the current supplied via the collector of transistor 211 exceeds a predetermined threshold, the latch formed by transistors 74 and 76 is enabled since the voltage across resistor 72 exceeds the turn on voltage of transistor 74. This disables base current to transistor 86 which has the effect of rendering transistors 86, 88, 92, 100, 102 and 126 non-operative thereby disabling the clamping operation as described above. This now allows the voltage appearing at circuit node 50 and terminal 24 to increase.

In addition, output voltage detection circuit 54 is shown such that when the voltage appearing at terminal 24 increases and exceeds a predetermined value, transistors 145 and 147 are rendered operative. In particular, transistor 145 functions to steal current away from circuit node 50, while transistor 147 functions to program programmable current source 98 to a significantly lower value.

In summary, the circuit shown in FIG. 3 includes a clamping circuit which holds the voltage appearing at terminal 24 to a low predetermined voltage until the current supplied via the collector of transistor 211 exceeds a predetermined threshold level. At this point, a latch is enabled which thereby disables the clamping circuit and allows the voltage appearing at terminal 24 to increase. This voltage increases until output voltage detection circuit 54 regulates this output voltage level.

Referring to FIG. 4, a portion of the circuitry of control die 20 is shown for illustrating the detailed operation of noise immunity enhancement circuit 56 shown in FIG. 2. It is understood that components shown in FIG. 4 which are identical to components shown in FIGS. 1, 2 and 3 are identified by the same reference numbers.

Noise immunity enhancement circuit 56 includes first and second switches 160 and 161. First switch 160 includes transistor 162 having a collector coupled to terminal 13 and an emitter coupled through resistor 164 to the base of transistor 166. The base of transistor 162 (which represents the input of noise immunity enhancement circuit 56) is coupled through resistor 168 to terminal 26, while the base of transistor 166 is coupled through resistor 170 to terminal 26. The collector of transistor 166 is coupled to the base of transistor 172 the later of which has an emitter coupled to the base of transistor 162. The collector of transistor 172 and the emitter of transistor 166 are coupled to terminal 26.

Second switch 161 includes transistor 174 which has a collector coupled to terminal 13 and an emitter coupled through resistor 176 to the base of transistor 178. The base of transistor 174 is coupled to the base of transistor 172. The base of transistor 178 is coupled through resistor 180 to terminal 26. The collector of transistor 178 is coupled to the base of transistor 182 the later of which has an emitter coupled to the base of transistor 174. The collector of transistor 182 as well as the emitter of transistor 178 are coupled to terminal 26.

Noise immunity enhancement circuit 56 further includes transistor 186 having an emitter coupled to the base of transistor 182 and a collector coupled to the bases of transistors 188, 189 and 190. The base of transistor 186 is coupled to circuit node 50, while the base of transistor 188 is coupled through resistor 192 to the emitter of transistor 118. The emitter of transistor 188 is also coupled to the emitter of transistor 118 and to the base of transistor 104. The emitter of transistor 189 is coupled to the second emitter of transistor 104 while the emitter of transistor 190 is coupled to the first emitter of transistor 104. The collectors of transistors 188–190 are each coupled to terminal 26.

Finally, the bases of transistors 172 and 174 are coupled through resistor 216 to the anode of zener diode 218. The cathode of zener diode 218 is coupled to terminal 24.

The circuit shown in FIG. 4 also includes a portion of interface circuit 35 that is needed for describing the operation of noise immunity enhancement circuit 56. In particular, interface circuit 35 includes transistor 212 having an emitter coupled through resistor 214 to terminal 12 and a collector coupled to the base of transistor 162. The base of transistor 212 is coupled to the anode of zener diode 112.

In operation, the circuit shown in FIG. 4 applies an excess reverse bias of approximately 7 volts across the emitter-base junction of PNP transistor 134 thereby preventing false triggering of output SCR 58. The excess reverse bias voltage ($V_{RB}$) that is applied across the emitter base junction of transistor 134 can be calculated as shown in equation 1.

$$V_{RB} = V_{D110} + V_{D112} + V_{D114} + V_{BE(118)} - V_{BE(104)} - V_{D148} \quad (1)$$

where $V_{D110}, V_{D112}, V_{D114}, V_{D148}$ are the respective voltages appearing across zener diodes 110, 112, 114 and 148; and $V_{BE(118)}$ and $V_{BE(104)}$ are the respective voltages appearing across the base-emitter junctions of transistors 118 and 104.

By applying this excess reverse bias voltage across the emitter-base junction of transistor 134, the threshold voltage to turn on SCR 58 from its top gate is increased by such voltage. This provides substantial noise immunity because now the voltage appearing at the emitter of transistor 134 must increase approximately 7 volts above the voltage at the base of transistor 134 during inductive load switching transients in order to false trigger transistor 134.

However, because an excess reverse bias voltage has been provided across the emitter-base junction of transistor 134, when it is desired to trigger output SCR 58 so that the voltage appearing at terminal 24 can be rapidly reduced, additional circuitry is required so that the propagation delay to turn on output SCR 58 is not substantially degraded.

This additional circuitry includes first and second switches 160 and 161, respectively. Switch 160 is rendered operative when the current supplied via the collector of transistor 212 exceeds a predetermined value wherein this corresponds to an input current appearing at terminal 12 exceeding some predetermined level. This renders the output of switch 160, which provides the voltage appearing at the collector of transistor 166, to be equal to a voltage that is less than the turn-on voltage for switch 161. For example, the output voltage of switch 160 may be $(3 \times V_{BE})$. As a result, when switch 160 is rendered operative, it functions to prevent switch 161 from turning on by clamping the input of switch 161 to a voltage less than its turn on voltage which may be for example $(4 \times V_{BE})$.

However, when the signal appearing at terminal 12 is removed, this causes the current supplied via the collector of transistor 212 to be substantially zero and switch 160 is subsequently disabled thereby allowing the voltage at the input of switch 161 to increase, via resistor 216 and diode 218 and the voltage appearing across terminals 24 and 26, and thereby turning on switch 161. This turns on transistor 174 and allows current to flow through transistors 178 and 186 wherein transistor 186 drives PNP transistors 188–190. Moreover, transistors 188–190 function to rapidly slew the base of transistor 134 thereby firing output SCR 58. This has the effect of rapidly decreasing the voltage appearing at terminal 24 in spite of the excess reverse bias voltage that was initially applied across the emitter-base junction of transistor 134.

In summary, the circuit shown in FIG. 4 includes circuitry for applying an excess reverse bias voltage across the emitter-base junction of transistor 134 thereby preventing output SCR 58 from false triggering. In addition, the circuit shown in FIG. 4 also includes circuitry for rapidly slewing output SCR 58 by detecting when the input signal appearing at terminal 12 has fallen below a predetermined threshold and subsequently activating circuitry to pull current out from the base of transistor 134 thereby rapidly turning on output SCR 58.

Figure 5:
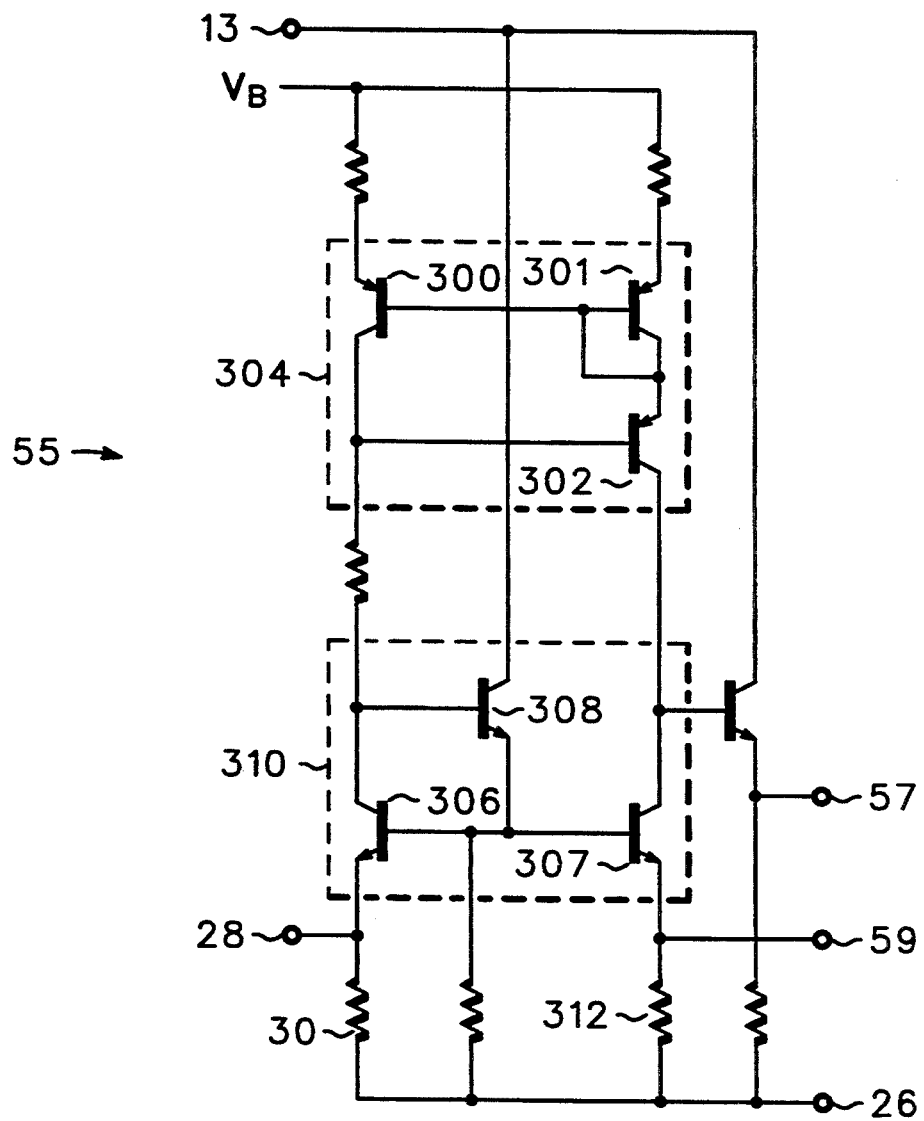
FIG. 5 is a detailed schematic diagram illustrating the voltage-current converter shown in FIG. 2.

Referring to FIG. 5, a detailed schematic diagram of at least one circuit implementation of V-I converter 55 is shown. It is understood that components shown in FIG. 5 which are identical to components shown in FIG. 2 are identified by the same reference numbers. In particular, transistors 300–302 form a first current mirror as denoted by reference number 304. Similarly, transistors 306–308 form a second current mirror as denoted by reference number 310.

In operation, current mirror 304 assures that the current flowing through transistor 306 is substantially equal to the current flowing through transistor 307. Moreover, if the voltage at terminal 28 is increased, then the voltage appearing across resistor 312 must also increase. However, since the current through transistor 307 is substantially equal to the current flowing through transistor 306, this excess current needed to flow through resistor 312 to create the increased voltage must be pulled out from terminal 59. As a result, the current flowing through terminal 59 is a current that is indicative of the voltage appearing at terminal 28 which, as aforementioned, is a voltage that is indicative of the current flowing through power transistor 25. Thus, the current flowing through terminal 59 is proportional to the current flowing through power transistor 25, as is desired. Additionally, terminal 57 provides a bias voltage that will be applied to a transistor shown in FIG. 7.

Figure 6:
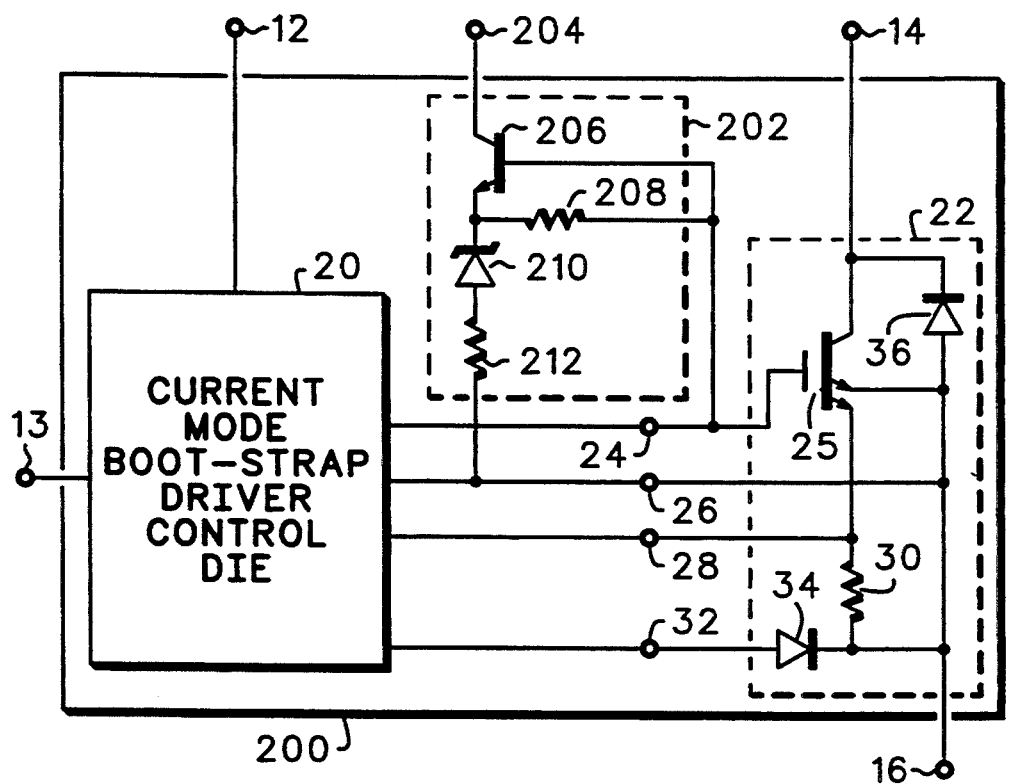
FIG. 6 is a schematic/block diagram illustrating a five-leaded current controlled, boot-strap driven control circuit coupled to a power device for protecting the power device and having a status monitor output.

Referring to FIG. 6, a schematic/block diagram illustrating five-leaded current controlled, boot-strap driven power device 200 is shown. It is understood that components shown in FIG. 6 which are identical to components shown in FIG. 1 are identified by the same reference numbers. In addition, power device 200 includes status monitoring circuit 202 being coupled across the base and first emitter of transistor 25 for providing an output at a fifth terminal of device 200 as designated by reference number 204 wherein terminals 12, 13, 14 and 16 are the other 4 terminals of device 200. Status monitoring circuit 202 provides a current output signal via terminal 204 that indicates the presence of sufficient base-emitter potential across transistor 25.

Status monitoring circuit 202 includes transistor 206 having a base coupled to the base of transistor 25 and a collector coupled to terminal 204. Resistor 208 is coupled across the emitter and base of transistor 206 while the emitter of transistor 206 is coupled to the cathode of zener diode 210. The anode of zener diode 210 is coupled through resistor 212 to the first emitter of transistor 25.

In operation, if the voltage across the base and first emitter of transistor 25 exceeds a predetermined threshold as determined by zener diode 210 and the forward drop of transistor 206, then transistor 206 is rendered operative thereby providing a current at terminal 204 wherein the current sunk at terminal 204 can be set to a desired value by choosing an appropriate value for resistor 212.

In summary, when there exists a current flowing a terminal 204, this indicates that a predetermined base emitter potential across transistor 25 has been obtained thereby reporting the status of transistor 25.

Figure 7:
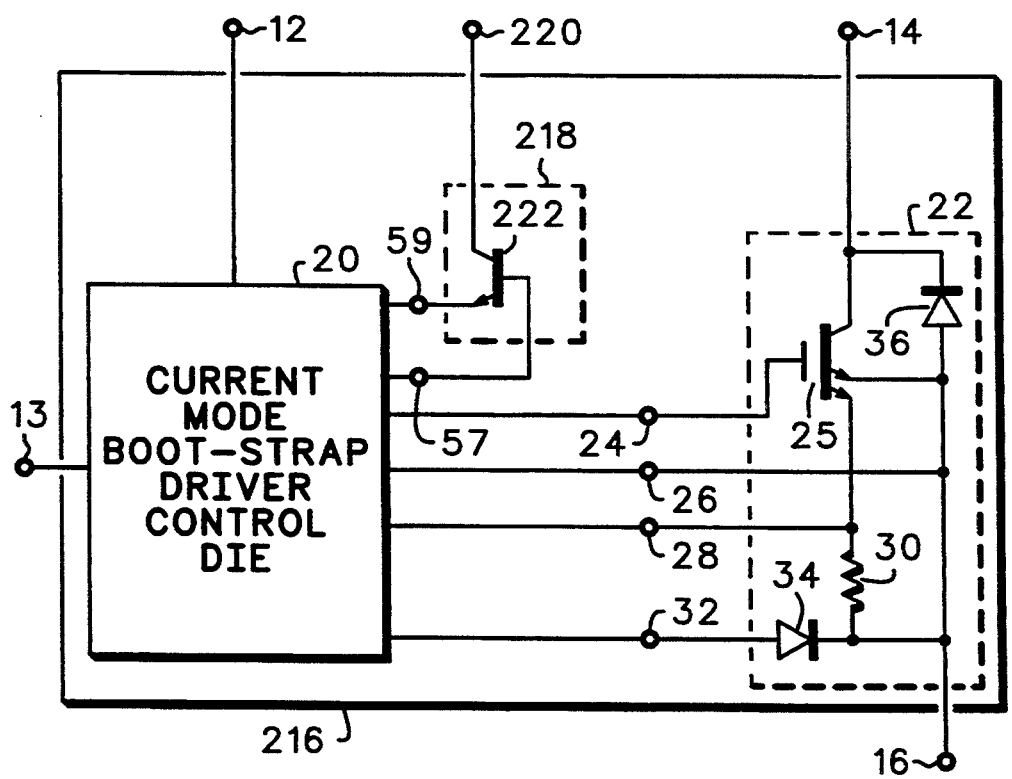
FIG. 7 is a schematic/block diagram illustrating a five-leaded current controlled, boot-strap driven control circuit coupled to a power device for protecting the power device and having a current monitor output.

Referring to FIG. 7, a schematic/block diagram illustrating a five-leaded current controlled, boot-strap driven power device 216 is shown. It is understood that components shown FIG. 7 which are identical to components shown in FIGS. 1, 2, 5 and 6 are identified by the same reference numbers. In particular, device 216 includes a current monitoring circuit including V-I converter 55 and current output device 218. Current output device 218 is coupled to control die 20 via bias terminal 57 and current terminal 59 for providing an output current at a fifth terminal of device 216 as indicated by reference number 220 wherein this output current at terminal 220 is proportional to the current flowing through power transistor 25. In particular, current output device 218 includes a high voltage transistor 222 having an emitter coupled to current terminal 59 which provides a current that is proportional to the current flowing through transistor 25. Further, transistor 222 has a base coupled to bias terminal 57. Further, the collector of transistor 222 provides a current output signal at terminal 220 which is proportional to the current flowing through transistor 25.

Figure 8:
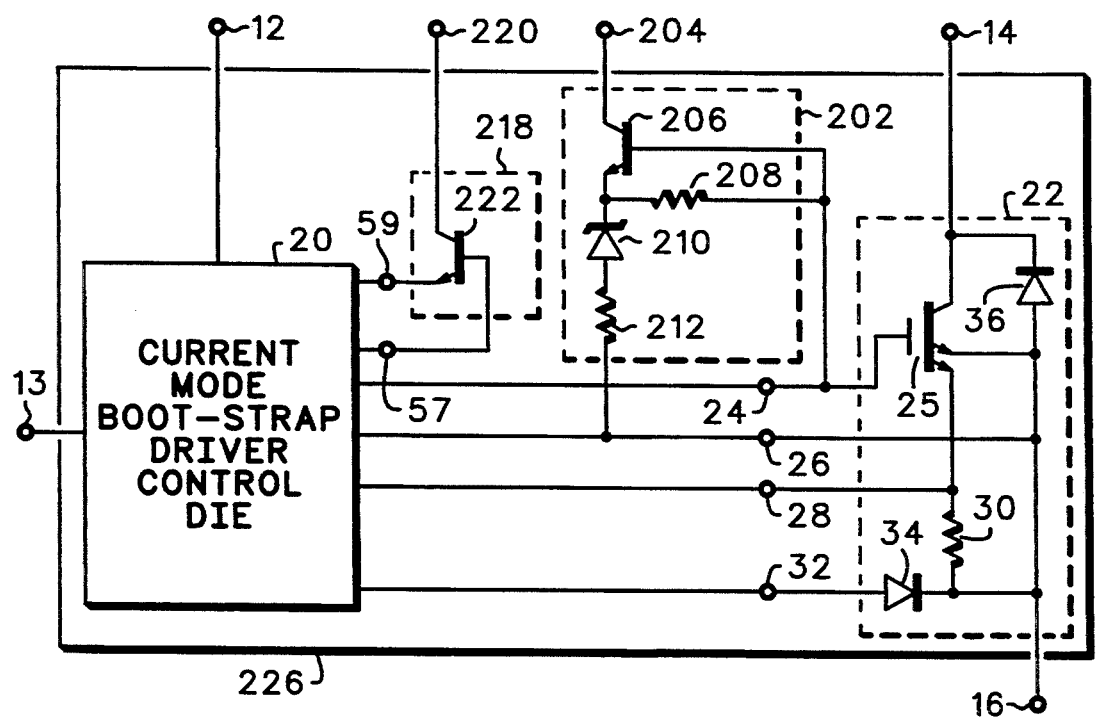
FIG. 8 is a schematic/block diagram illustrating a six-leaded current controlled, boot-strap driven control circuit coupled to a power device for protecting the power device and having both status and current monitor outputs.

Referring to FIG. 8, a schematic/block diagram illustrating a six-leaded current controlled, boot-strap driven power device 226 is shown. It is understood that components shown in FIG. 8 that are identical to components shown in FIGS. 1, 2, 5, 6 and 7 are identified by the same reference numbers. In particular, the circuit shown in FIG. 7 combines the four-leaded device shown in FIG. 1 with the status monitoring circuit shown in FIG. 6 and the current monitoring circuit shown in FIG. 7 to obtain a six-leaded device as shown in FIG. 8.

By now it should be apparent from the foregoing discussion that a novel current controlled, boot-strap driven control die for use with a power device has been provided. The current controlled, boot-strap driven control die includes an under voltage lock-out circuit which inhibits drive to the power device until the input signals have exceeded a predetermined threshold. Moreover, the control die includes a noise immunity enhancement circuit for providing an excess reverse bias across an output SCR for preventing false triggering of the output SCR.

While the invention has been described in specific embodiments, it is evident that many alterations, modifications, and variations will be apparent to those skilled in the art. Further, it is intended to embrace all such alterations, modifications and variations in the appended claims.

We claim:

1. A protected power device having at least four leads, comprising:
    a power transistor having first and second current carrying terminals, a sense terminal and a control terminal, the first current carrying terminal serving as a first lead and the second current carrying terminal serving as a second lead of the protected power device;
    a control circuit for protecting said power transistor and having a plurality of terminals, a first one of said plurality of terminals serving as a third lead of the protected power device, wherein an input signal is supplied at the third lead, a second one of said plurality of terminals being coupled to said control terminal of said power transistor, a third one of said plurality of terminals being coupled to said second current carrying terminal of said power transistor, fourth and fifth ones of said plurality of terminals being coupled to said sense terminal of said power transistor, and a sixth one of said plurality of terminals serving as a fourth lead of the protected power device; and
    boot-strap means, wherein the boot-strap means couples first supply voltage terminal to said fourth lead of the protected power device for supplying power to said control circuit.

2. The protected power device according to claim 1 further including a fifth lead and status means, wherein the status means is coupled between said fifth lead and said second lead of the protected power device and indicates when a voltage occurring across said control and said second current carrying terminals of said power transistor has exceeded a predetermined threshold.

3. The protected power device according to claim 2 wherein said status means includes:
    a transistor having a collector, a base and an emitter, said base of said transistor coupled to said control terminal of said power transistor, said collector of said transistor coupled to said fifth lead;
    a zener diode having an anode and a cathode, said cathode of said zener diode coupled to said emitter of said transistor;
    a first resistor coupled between said base and emitter of said transistor; and
    a second resistor coupled between said anode of said zener diode and said second current carrying terminal of said power transistor.

4. The protected power device according to claim 1 further including current monitoring means coupled to said control circuit for providing a current at a fifth lead of the multi-leaded protected power device that is proportional to a current flowing through said power transistor.

5. The protected power device according to claim 4, wherein said current monitoring means includes:
    converter means coupled between said fourth lead and said third one of said plurality of terminals, wherein the converter means is responsive to a voltage appearing at said fourth one of said plurality of terminals and provides a current at an output that is proportional to a current flowing through said power transistor; and
    a transistor having a collector, a base and an emitter, said collector of said transistor coupled to said fifth lead, said base of said transistor coupled to receive a bias voltage, said emitter of said transistor coupled to said output of said converter means.

6. The protected power device according to claim 1 further including:
    current monitoring means coupled to said control circuit for providing a current at a fifth lead of the protected power device that is proportional to a current flowing through said power transistor; and
    status means coupled between a sixth and said second leads of the protected power device for indicating when a voltage occurring across said control and second current carrying terminals of said power transistor has exceeded a predetermined threshold.

7. A protected power device having at least four leads, comprising:
    a power transistor having first and second current carrying terminals, a sense terminal and a control terminal, the first current carrying terminal serving as a first lead and the second current carrying terminal serving as a second lead of the protected power device;

a control circuit for protecting said power transistor and having a plurality of terminals, a first one of said plurality of terminals serving as a third lead of the protected power device, wherein an input signal is supplied at the third lead, a second one of said plurality of terminals being coupled to said control terminal of said power transistor, a third one of said plurality of terminals being coupled to said second current carrying terminal of said power transistor, fourth and fifth ones of said plurality of terminals being coupled to said sense terminal of said power transistor, and a sixth one of said plurality of terminals serving as a fourth lead of the protected power device, wherein said control circuit includes:

an over current detection means for providing a signal at an output of said over current detection means when a current through said power transistor exceeds a first predetermined current level, said over current detection means being coupled between said fourth lead of the protected power device and said third one of said plurality of terminals and being responsive to a signal appearing between said fourth one and said third one of said plurality of terminals;

an over temperature detection means being coupled between said fourth lead of the protected power device and said third one of said plurality of terminals and being responsive to a voltage appearing between said fifth one and said third one of said plurality of terminals for providing a signal at an output of said over temperature detection means when a temperature of said power transistor exceeds a predetermined temperature;

an under voltage lockout means being coupled between said third lead of the protected power device and said third one of said plurality of terminals for providing a signal at an output of said under voltage lockout means when a signal appearing at said third lead exceeds a second predetermined current level;

output drive means having a control terminal, an input and an output for providing drive current to said second one of said plurality of terminals, said control terminal of said output drive means being coupled to said output of said under voltage lockout means, said input of said output drive means being coupled to said first one of said plurality of terminals, said output of said output drive means being coupled to said second one of said plurality of terminals;

first SCR means for decreasing a voltage appearing across said second and third ones of said plurality of terminals, said first SCR means having first and second current carrying terminals and a first input terminal, said first and second current carrying terminals of said first SCR means being respectively coupled to said second one and said third one of said plurality of terminals; and second SCR means for enabling said first SCR means, said second SCR means having first and second input terminals respectively coupled to said outputs of said over temperature detection means and said over current detection means, said second SCR means having a first output terminal coupled to said first input terminal of said first SCR means; and boot-strap means, wherein the boot-strap means couples a first supply voltage terminal to said fourth lead of the protected power device for supplying power to said control circuit.

8. The protected power device according to claim 7 wherein said control circuit further includes a noise immunity enhancement circuit being coupled across said first SCR means, said noise immunity enhancement circuit being responsive to a signal appearing at said third lead for preventing said first SCR means from false triggering.

9. The protected power device according to claim 8 wherein said noise immunity enhancement circuit includes:

diode bias means being coupled across said first SCR means for preventing said first SCR means from false triggering;

a first switch having an input and an output, said input of said first switch being responsive to a signal appearing at said third lead, said output of said first switch providing a first voltage when said first switch is rendered operative;

a second switch having an input and an output, said input of said second switch being coupled to said output of said first switch, said second switch being rendered operative when a voltage appearing at said input of said second switch exceeds a predetermined threshold voltage wherein said predetermined threshold voltage is greater than said first voltage; and driving means being coupled to said output of said second switch for firing said first SCR means when said second switch is rendered operative, said driving means having an output coupled to said first SCR means, said second switch being coupled to said second one of said plurality of terminals and being rendered operative when said voltage appearing at said first one of said plurality of terminals decreases such that said first switch is rendered non-operative thereby allowing a voltage appearing at said input of said second switch to exceed said predetermined voltage.

10. The protected power device according to claim 7 wherein said control circuit further includes an output voltage detection circuit being coupled between said input of said output drive means and said third one of said plurality of terminals, said output voltage detection circuit having an input responsive to a voltage appearing at said second one of the plurality of terminals for limiting said output drive means.

11. The protected power device according to claim 7 wherein said under voltage lockout means includes:

clamping means being coupled to said second one of said plurality of terminals for clamping a voltage appearing at said second one of said plurality of terminals to a predetermined value when a signal appearing at said third lead is below the second predetermined current level; and latch means having an input and an output for disabling said clamping means when said signal appearing at said third lead exceeds said second predetermined current level, said input of said latch means being coupled to said third lead, said output of said latch means being coupled to said clamping means.

12. The protected power device according to claim 7 further including a fifth lead and status means, wherein the status means is coupled between said fifth lead and said second lead of the protected power device and indicates when a voltage occurring across said control and said second current carrying terminals of said power transistor has exceeded a predetermined threshold.

13. The protected power device according to claim 12 wherein said status means includes: a transistor having a collector, a base and an emitter, said base of said transistor coupled to said control terminal of said power transistor, said collector of said transistor coupled to said fifth lead;
   a zener diode having an anode and a cathode, said cathode of said zener diode coupled to said emitter of said transistor;
   a first resistor coupled between said base and emitter of said transistor; and
   a second resistor coupled between said anode of said zener diode and said second current carrying terminal of said power transistor.

14. The protected power device according to claim 7 further including current monitoring means coupled to said control circuit for providing a current at a fifth lead of the protected power device that is proportional to a current flowing through said power transistor.

15. The protected power device according to claim 14 wherein said current monitoring means includes:
   converter means coupled between said fourth lead and said third one of said plurality of terminals, wherein the converter means is responsive to a voltage appearing at said fourth one of said plurality of terminals and provides a current at an output that is proportional to a current flowing through said power transistor; and
   a transistor having a collector, a base and an emitter, said collector of said transistor coupled to said fifth lead, said base of said transistor coupled to receive a bias voltage, said emitter of said transistor coupled to said output of said converter means.

16. The protected power device according to claim 7 further including:
   current monitoring means coupled to said control circuit for providing a current at a fifth lead of the protected power device that is proportional to a current flowing through said power transistor; and
   status means coupled between a sixth and said second leads of the protected power device for indicating when a voltage occurring across said control and second current carrying terminals of said power transistor has exceeded a predetermined threshold.

* * * * *

UNITED STATES PATENT AND TRADEMARK OFFICE
CERTIFICATE OF CORRECTION

PATENT NO. : 5,418,674
DATED : May 23, 1995
INVENTOR(S) : Robert B. Davies et al.

It is certified that error appears in the above-indentified patent and that said Letters Patent is hereby corrected as shown below:

In column 12, line 7, claim 1, before "first" insert --a--.

In column 12, line 35, claim 4, delete "multi-leaded".

Signed and Sealed this

Seventeenth Day of October, 1995

Attest:

BRUCE LEHMAN

Attesting Officer     Commissioner of Patents and Trademarks